US012740325B2

(12) United States Patent
Le et al.

(10) Patent No.: US 12,740,325 B2
(45) Date of Patent: Sep. 15, 2026

(54) SENSOR BASED ON DIRECT SPIN HALL EFFECT

(71) Applicant: Western Digital Technologies, Inc., San Jose, CA (US)

(72) Inventors: Quang Le, San Jose, CA (US); Xiaoyong Liu, San Jose, CA (US); Maki Maeda, Fujisawa (JP); Hisashi Takano, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 321 days.

(21) Appl. No.: 18/666,543

(22) Filed: May 16, 2024

(65) Prior Publication Data

US 2025/0359486 A1 Nov. 20, 2025

(51) Int. Cl.

| | |
|---|---|
| ***H10N 50/20*** | (2023.01) |
| ***G01R 33/07*** | (2006.01) |
| ***G11C 11/16*** | (2006.01) |
| ***H10N 52/00*** | (2023.01) |

(52) U.S. Cl.
CPC ........... *H10N 50/20* (2023.02); *G01R 33/075* (2013.01); *G11C 11/1673* (2013.01); *G11C 11/1675* (2013.01); *H10N 52/101* (2023.02)

(58) Field of Classification Search
CPC . G11C 11/16; G11C 11/1673; G11C 11/1675; G01R 33/07; G01R 33/075; H10N 52/101; H10N 50/20
See application file for complete search history.

(56) References Cited

U.S. PATENT DOCUMENTS

| | | | | |
|---|---|---|---|---|
| 2023/0086080 | A1* | 3/2023 | Lin | H10N 50/20 257/426 |
| 2024/0349624 | A1* | 10/2024 | Yablonovitch | H01Q 1/248 |
| 2025/0322862 | A1* | 10/2025 | Ho | G11C 11/161 |

* cited by examiner

*Primary Examiner* — David C Spalla
(74) *Attorney, Agent, or Firm* — Patterson + Sheridan, LLP

(57) ABSTRACT

The present disclosure generally relates to a magnetic recording device comprising a current-in-plane (CIP) spin orbit torque (SOT) device. The SOT device comprises a topological material (TM) layer and one or more free layers. The TM layer may be recessed from the MFS, and may comprise BiSb or YPtBi. Current is configured to flow in-plane into the TM layer. In one embodiment, one or more free layers are disposed on a same surface of the TM layer. In another embodiment, one or more free layers are disposed on opposite surfaces of the TM layer. In embodiments, comprising two or more free layers, voltage outputs read from at least two of the two or more free layers are opposite, and the two free layers have opposite polarities. In another embodiment, the SOT device comprises four free layers arranged in a bridge configuration.

22 Claims, 10 Drawing Sheets

SENSOR BASED ON DIRECT SPIN HALL EFFECT

BACKGROUND OF THE DISCLOSURE

Field of the Disclosure

Embodiments of the present disclosure generally relate to spin-orbit torque (SOT) read heads comprising topological materials (TM) layers, such as topological insulator (TI) or topological semi-metal (TSM) layers.

Description of the Related Art

TM layers are narrow band gap topological insulators with both giant spin Hall effect and high surface electrical conductivity. BiSb and YPtBi are materials that has been proposed in various spin-orbit torque (SOT) device applications, such as for a spin Hall layer for magnetoresistive random access memory (MRAM) devices and energy-assisted magnetic recording (EAMR) write heads.

Such SOT devices can either be current-in-plane (CIP) SOT devices, where current is applied in-plane to the TM layer, or current-perpendicular-to-plane (CPP) SOT devices, where current is applied perpendicular to the plane of the TM layer. With CPP SOT devices, the spin current inside the TM layer may be canted due to the convolution of both direct and indirect spin Hall effects, resulting in a saturated electrical signal output, where the full potential of a larger spin Hall angle from the TM layer cannot be fully utilized.

Therefore, there is a need for an improved SOT device in read heads and magnetic sensors comprising TM layer(s) able to utilize the full potential of large spin Hall angles.

SUMMARY OF THE DISCLOSURE

The present disclosure generally relates to a magnetic recording device comprising a current-in-plane (CIP) spin orbit torque (SOT) device. The SOT device comprises a topological material (TM) layer and one or more free layers. The TM layer may be recessed from the MFS, and may comprise BiSb or YPtBi. Current is configured to flow in-plane into the TM layer. In one embodiment, one or more free layers are disposed on a same surface of the TM layer. In another embodiment, one or more free layers are disposed on opposite surfaces of the TM layer. In embodiments, comprising two or more free layers, voltage outputs read from at least two of the two or more free layers are opposite, and the two free layers have opposite polarities. In another embodiment, the SOT device comprises four free layers arranged in a bridge configuration.

In one embodiment, a spin orbit torque (SOT) device comprises a first shield, a topological material (TM) layer disposed over the first shield, a first free layer disposed over the TM layer, a second free layer disposed over the TM layer, the second free layer being disposed adjacent to the first free layer, and a second shield disposed over the first and second free layers, wherein the SOT device is a current-in-plane (CIP) device.

In another embodiment, a spin orbit torque (SOT) device comprises a topological material (TM) layer having a first surface and a second surface opposite the first surface, a first free layer disposed on the first surface of the TM layer, and a second free layer disposed on the second surface of the TM layer, wherein the SOT device is a current-in-plane (CIP) device.

In yet another embodiment, a sensor comprises a Wheatstone bridge, the Wheatstone bridge comprising: a first free layer, a second free layer disposed adjacent to the first free layer, a topological material (TM) layer disposed over the first and second free layers, a third free layer disposed over the TM layer, a fourth free layer disposed adjacent to the third free layer, a first output lead disposed between the first free layer and the third free layer, a second output lead disposed between the second free layer and the fourth free layer, and means for measuring the voltage output between the first and second output leads.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a magnetic recording device comprising a current-in-plane (CIP) spin orbit torque (SOT) device. The SOT device comprises a topological material (TM) layer and one or more free layers. The TM layer may be recessed from the MFS, and may comprise BiSb or YPtBi. Current is configured to flow in-plane into the TM layer. In one embodiment, one or more free layers are disposed on a same surface of the TM layer. In another embodiment, one or more free layers are disposed on opposite surfaces of the TM layer. In embodiments, comprising two or more free layers, voltage outputs read from at least two of the two or more free layers are opposite, and the two free layers have opposite polarities. In another embodiment, the SOT device comprises four free layers arranged in a bridge configuration.

Figure 1:
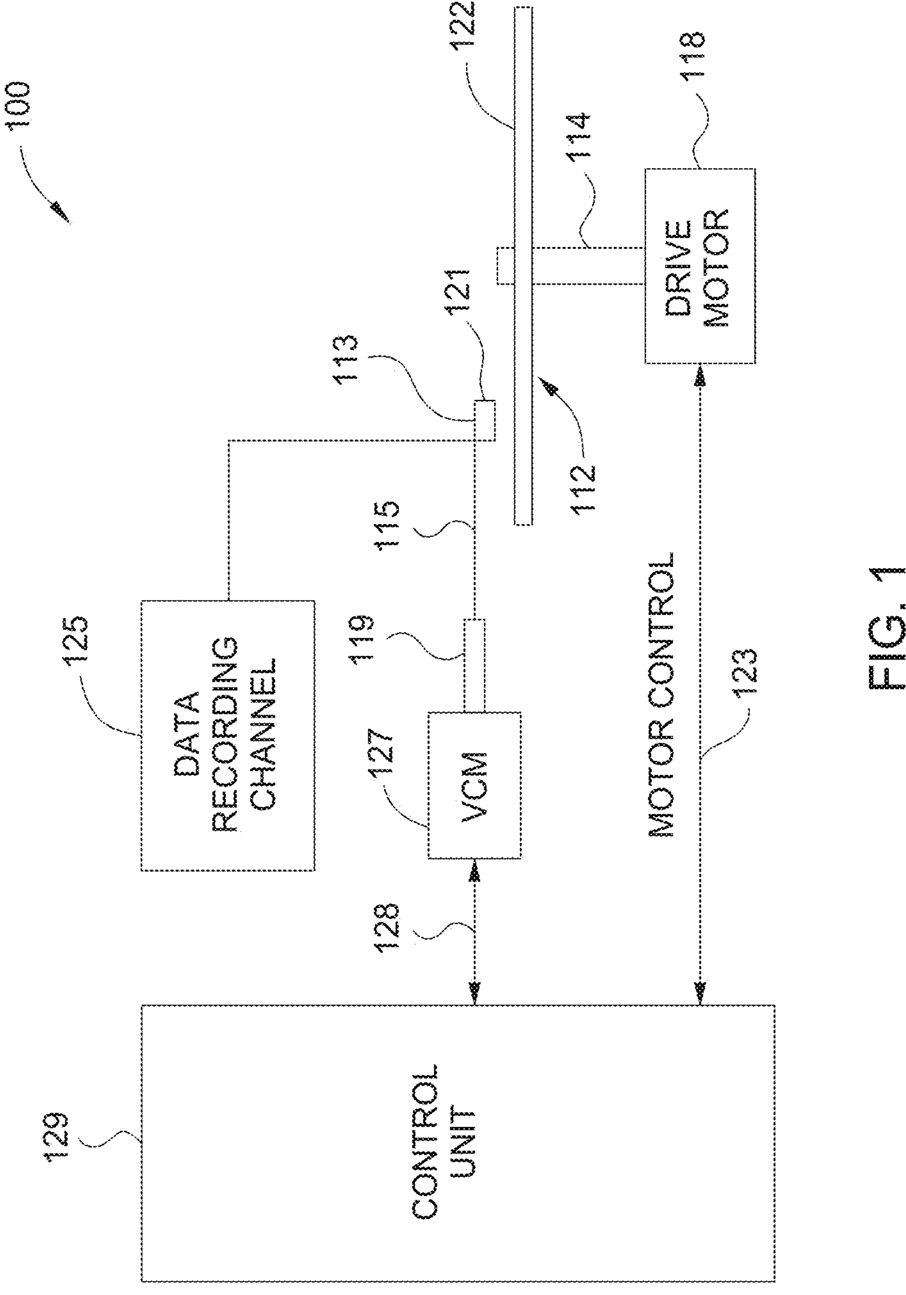
FIG. 1 is a schematic illustration of certain embodiments of a magnetic drive including a read/write head having a SOT device.

FIG. 1 is a schematic illustration of certain embodiments of a magnetic drive 100 including a recording head having a SOT device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
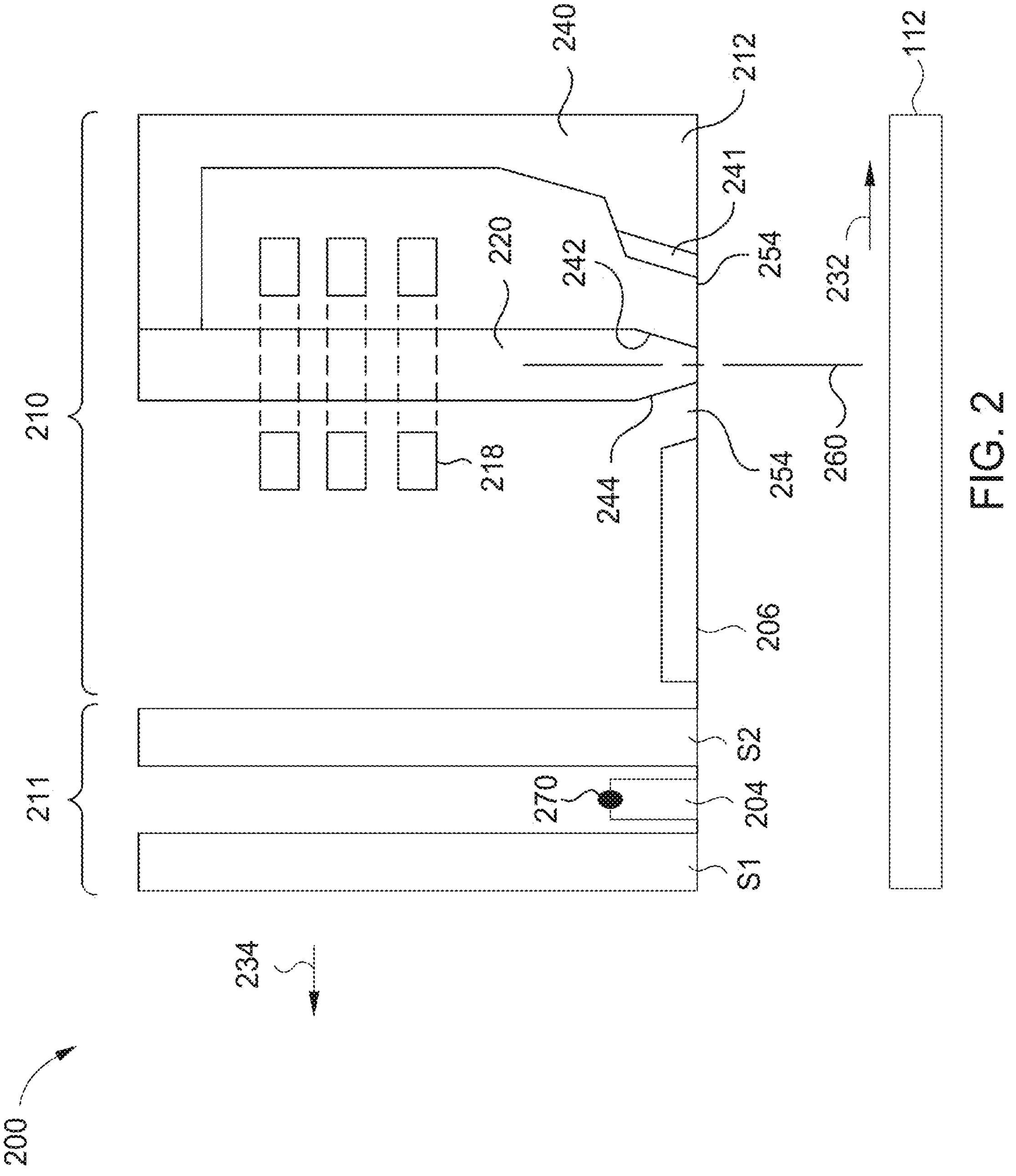
FIG. 2 is a fragmented, cross-sectional side view of certain embodiments of a read/write head having a SOT device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders.

FIG. 2 is a fragmented, cross-sectional side view of certain embodiments of a read/write head 200 having a SOT device. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a write head 210, and a magnetic read head 211. As shown in FIG. 2, the magnetic media 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits. The SOT device of various embodiments can be incorporated into the read head 211 as the sensing element. An example of an SOT read head is described in the patent titled "Topological Insulator Based Spin Torque Oscillator Reader," U.S. Pat. No. 11,783,853, issued Oct. 10, 2023, assigned to the same assignee of this application, which is herein incorporated by reference.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. In certain embodiments, the read/write head 200 additionally includes mechanisms (not shown) for supporting Heat Assisted Magnetic Recording (HAMR), which may include a waveguide coupled to a light source and a near field transducer (NFT) placed adjacent to the main pole 220 and coupled to the waveguide to convert the delivered light into a heating spot on the media. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy.

Figures 3A, 3B:
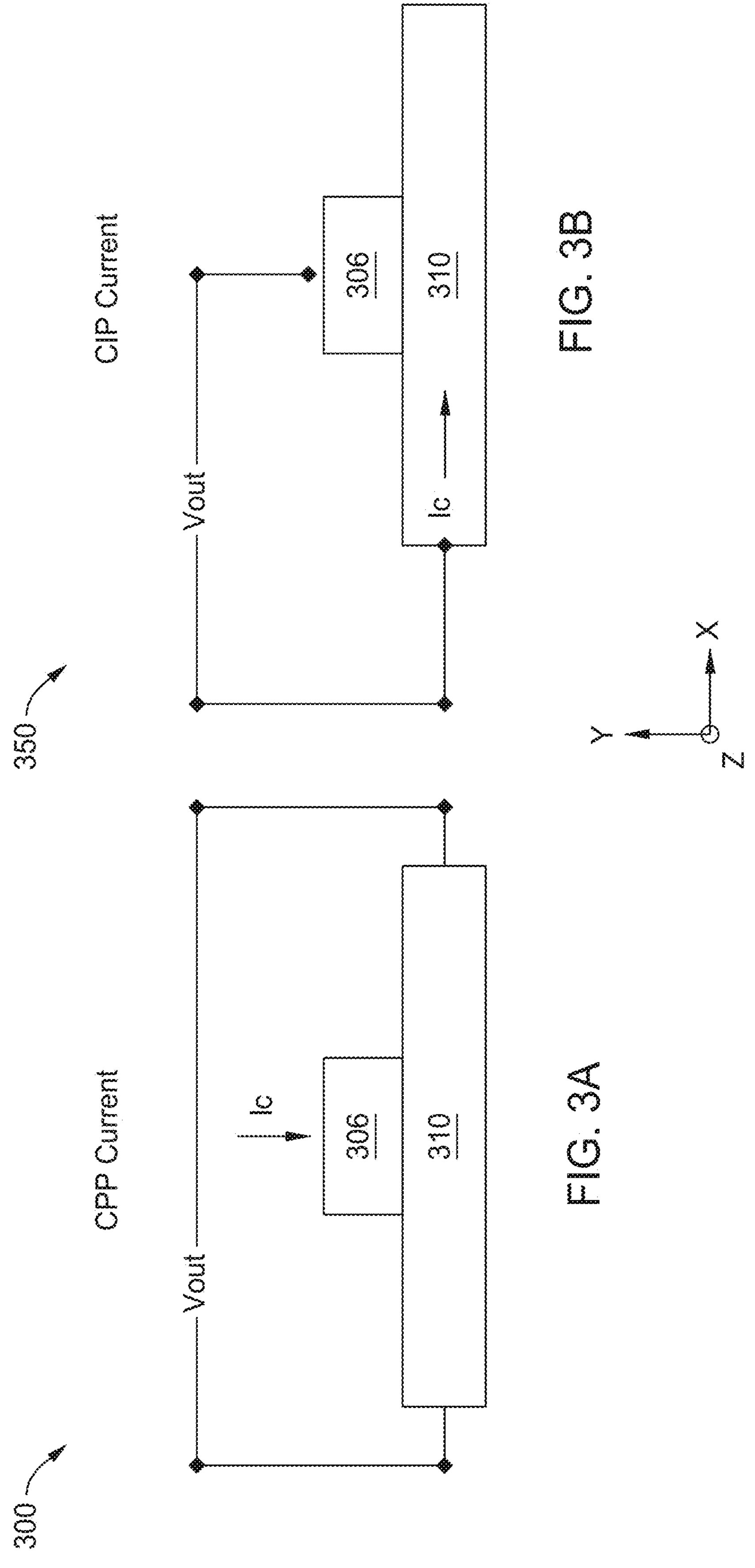
FIG. 3A illustrates a current-in-plane (CIP) SOT device, according to one embodiment.
FIG. 3B illustrates a current-perpendicular-plane (CPP) SOT device, according to another embodiment.

FIG. 3A illustrates a current-perpendicular-plane (CPP) SOT device 300, according to another embodiment. The CPP SOT device 300 may be used in read heads, such as the read head 211 of FIG. 2. The SOT device 300 comprises a topological material (TM) layer 310 and the free layer (FL) 306 disposed over the TM layer 310. The TM layer 310 may be referred to as a SOT layer, a TI layer, or a TSM layer. The TM layer 310 may comprise BiSb or YPtBi, for example. While the FL 306 is disposed over the TM layer 310, the TM layer 310 may be disposed over the FL 306 instead. The SOT device 300 may comprise additional layers not shown, such as a buffer layer, one or more interlayers, and/or a cap layer.

During operation, current (Ic) is applied to the top of the FL 306 in the −y-direction, or perpendicular to the plane of the TM layer 310. The output voltage (Vout) is read in-plane of the TM layer 310 based on the inverse spin Hall effect (iSHE), with the output voltage being reflective of the FL 306's magnetization as influenced by the external magnetic field to be sensed (e.g., emanating from magnetic recording media). Such CPP SOT devices 300 generally require the bulk conductivity property of the TM layer 310 to be lower and more insulating to minimize shunting during signal read out. Further, the spin current inside the TM layer 310 may be canted due to the convolution of both direct and indirect spin Hall effects inside the TM layer 310, resulting in a saturated electrical signal output, where the full potential of a larger spin Hall angle from the TM layer 310 cannot be fully utilized.

FIG. 3B illustrates a current-in-plane (CIP) SOT device 350, according to one embodiment. The CIP SOT device 350 may be used in memory applications, such as SOT MRAM, HDD write heads, such as the write head 210 of FIG. 2, and SOT-based logic devices, including artificial intelligence (AI) chips. In addition, as proposed further below in various embodiments, a CIP SOT device can also be used as a magnetic sensor based on the direct spin Hall effect, and such sensor can be used in magnetic recording read heads or stand-alone magnetic sensors. The SOT device 350 comprises a TM layer 310 and the FL 306 disposed over the TM layer 310. The TM layer 310 may be referred to as a SOT layer, a TI layer, or a TSM layer. The TM layer 310 may comprise BiSb or YPtBi, for example. While the FL 306 is disposed over the TM layer 310, the TM layer 310 may be disposed over the FL 306 instead. The SOT device 350 may comprise additional layers not shown, such as a buffer layer, one or more interlayers, and/or a cap layer.

During operation, current (Ic) is applied to the TM layer 310 in the x-direction, or in-plane with the TM layer 310. Due to the spin Hall effect, a spin current is generated and flows perpendicularly into the FL 306, causing the FL 306 to rotate or switch, which can be detected by measuring the voltage read out (Vout) based on an anomalous Hall effect or tunnel magnetoresistance (TMR) with an optional tunnel barrier layer (not shown) and a top pinned FM layer(s) (not shown). Such CIP SOT devices 350 have fast magnetic switching of the FL 306, and generally require the bulk conductivity property of the TM layer 310 to be high for less power consumption during operation. Because of the CIP nature and all induced spin currents flowing perpendicularly, the full potential of a larger spin Hall angle for TM materials can be fully utilized, which is important for highly efficient spin-to-charge conversion materials of the TM layer 310, such as BiSb and YPtBi.

FIGS. 4A-7B illustrate various CIP SOT devices 400, 500, 550, 600, 700, respectively, according to various embodiments. Each SOT device 400, 500, 550, 600, 700 may be the CIP SOT device 350 of FIG. 3B, where the TM layer 410 may be the TM layer 310 and at least one FL 406 may be the FL 306. The SOT devices 400, 500, 550, 600, 700 may be used in the magnetic recording head of the drive 100 of FIG. 1 or other suitable magnetic media drives, such as the read head 211 and/or write head 210 of FIG. 2. Furthermore, the SOT devices 400, 500, 550, 600, 700 may each individually or collectively be utilized in the two dimensional magnetic recording (TDMR) SOT read heads. Aspects of the SOT devices 400, 500, 550, 600, 700 may be used in combination with one another. Moreover, each SOT device 400, 500, 550, 600, 700 may comprise additional layers not shown, such as a buffer layer, a ferromagnetic layer, one or more interlayers, and/or a cap layer. In other embodiments, the various CIP SOT devices shown in these figures can be used as magnetic sensors in non-magnetic recording applications. In those cases, the shield layers would be optional, and the discussion of an MFS would not be applicable.

Figures 4A, 4B:
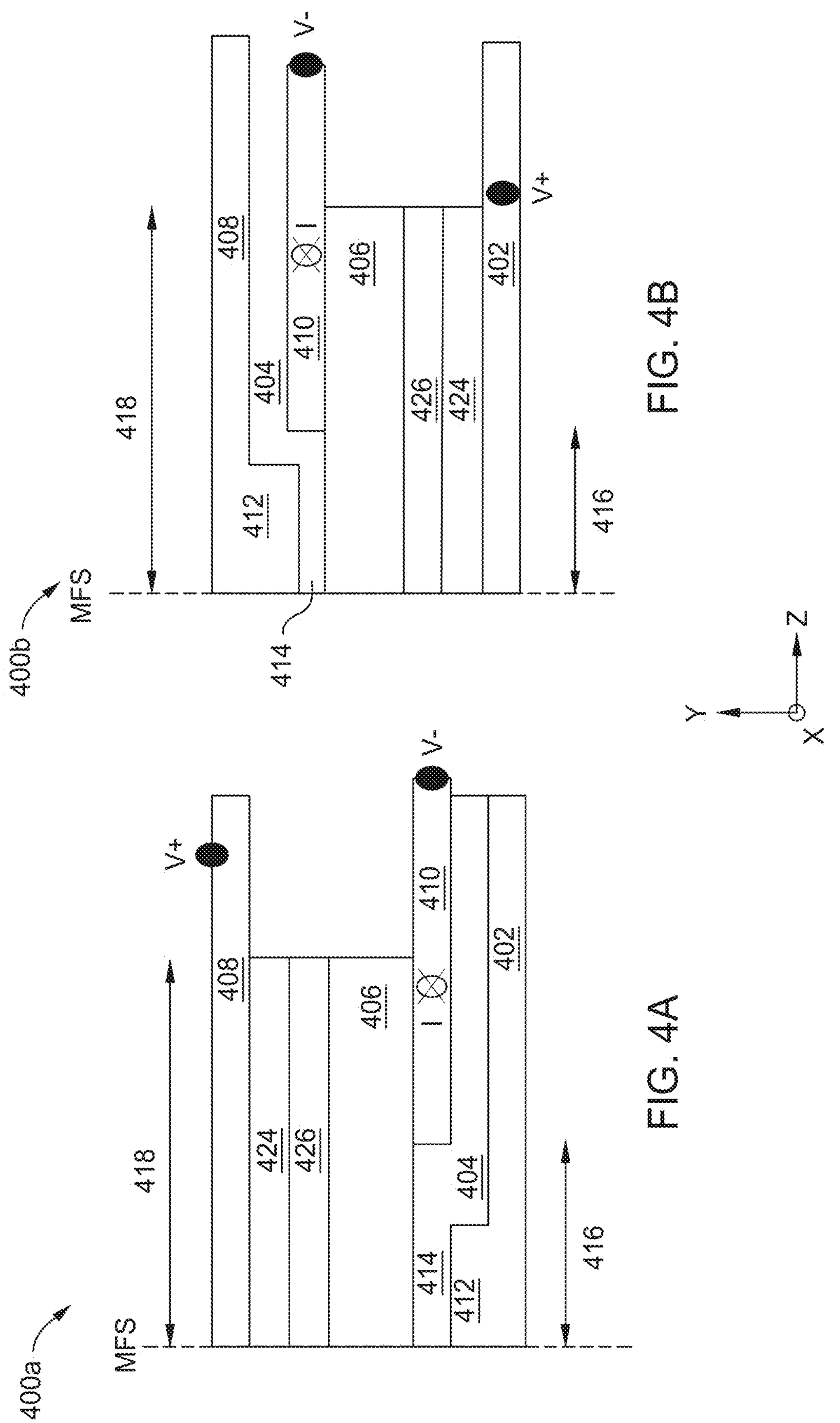
FIGS. 4A-4D illustrate a SOT device, according to one embodiment.
Figure 4D:
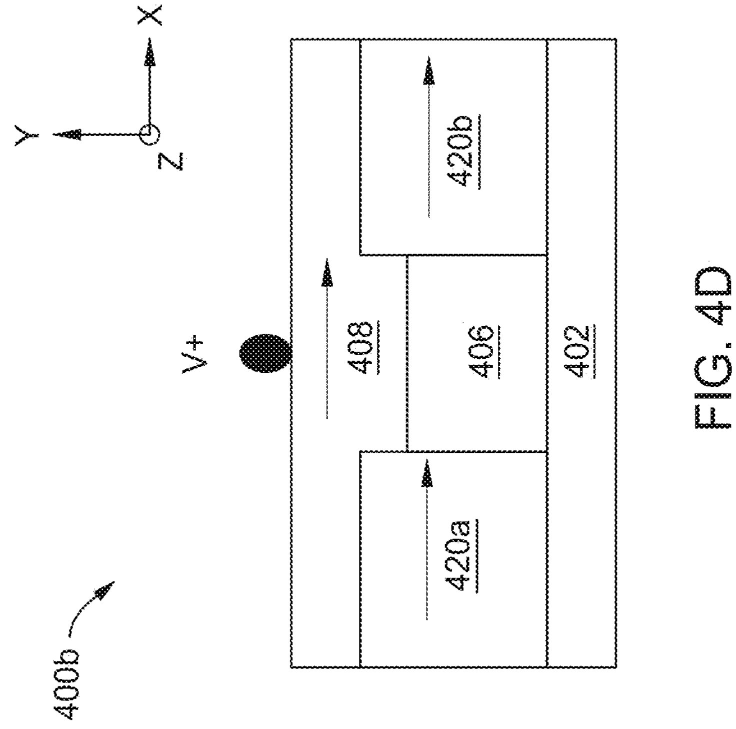
Figure 4C:
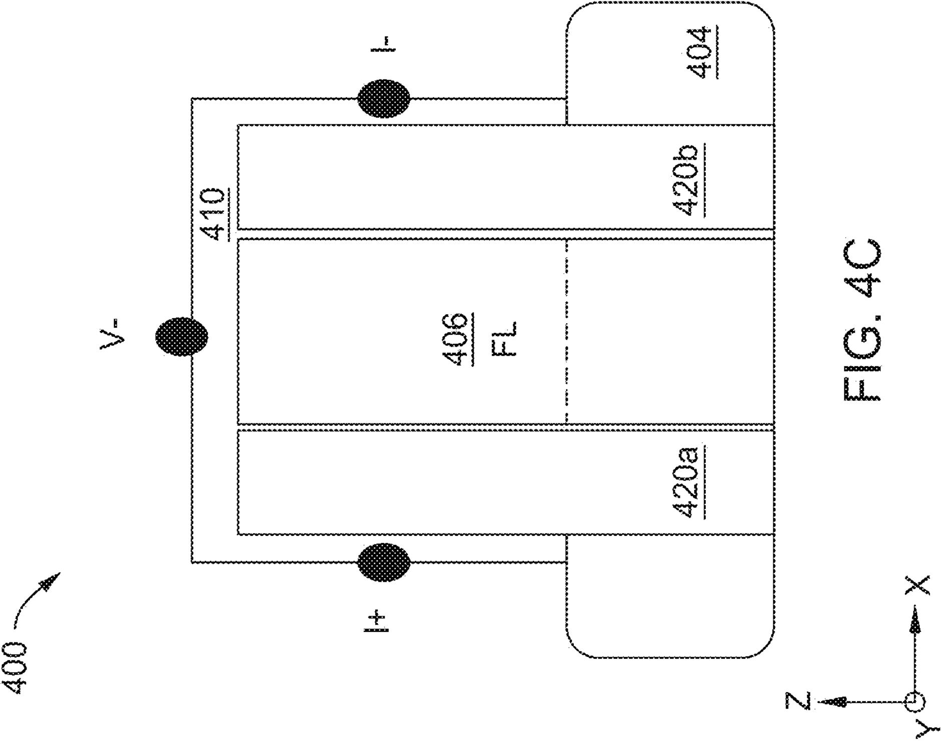

FIGS. 4A-4D illustrate a SOT device 400, according to one embodiment. FIG. 4A illustrates a cross-sectional APEX view of a bottom-TM based structure or first embodiment 400*a* of the SOT device 400, and FIG. 4B illustrates a cross-sectional APEX view of a top-TM based structure or second embodiment 400*b* of the SOT device 400. FIG. 4C is a top view of the SOT device with one shield removed for illustrative purpose. FIG. 4D shows an MFS view of the device. The SOT device 400 may be either the first embodiment 400*a* or the second embodiment 400*b*, and as such, the first and second embodiments 400*a*, 400*b* are interchangeably referred to as the SOT device 400. FIG. 4C illustrates a top view of the SOT device 400, and FIG. 4D illustrates a MFS view of the SOT device 400.

As shown in FIG. 4A, in the first embodiment 400*a*, the SOT device comprises a first shield 402 disposed at the MFS, an insulating layer 404 disposed over the first shield 402, a TM layer 410 disposed over the insulating layer 404, the TM layer 410 being recessed from the MFS, a free layer (FL) 406 disposed over the TM layer 410, an optional tunnel barrier layer 426 disposed on the FL 406, an optional pinned layer 424 disposed on the optional tunnel barrier layer 426, and a second shield 408 disposed over the FL 406 or the optional pinned layer 424. In embodiments comprising the optional tunnel barrier layer 426 and the optional pinned layer 424, the device comprises both the tunnel barrier layer 426 and the pinned layer 424. In some embodiments, the first shield 402 comprises a shield notch 412 at the MFS, and the insulating layer 404 comprises an insulating notch 414 at the MFS. The insulating notch 414 is disposed on the shield notch 412. The shield notch 412 and the insulating notch 414 collectively recess the TM layer 410 from the MFS a distance 416 of about 5 nm to about 20 nm. The FL 406 has a stripe height (SH) 418 from the MFS into the SOT device 400 of about 5 nm to about 30 nm. As shown in FIGS. 4C-4D, side shields 420*a*, 420*b* (collectively referred to as side shields 420) are disposed on either side of the FL layer 406 as the MFS.

The second embodiment 400*b* of the SOT device 400 is similar to the first embodiment 400*a*; however, the optional pinned layer 424 is disposed over the first shield 402, the optional tunnel barrier layer 426 is disposed on the optional pinned layer 424, the FL 406 is disposed over the first shield 402 or the optional tunnel barrier layer 426, the TM layer 410 is disposed over the FL 406, the insulating layer 404 is disposed over the TM layer 410, and the second shield 408 is disposed over the insulating layer 404. The second shield 408 further comprises the shield notch 412, rather than the first shield 402. The shield notch 412 and the insulating notch 414 still recess the TM layer 410 from the MFS.

The TM layer 410 may comprise BiSb or YPtBi. The TM layer 410 may be doped or undoped. The free layer 406 may comprise one or more of NiFe, CoFe, NiFeX, CoFeX, Cox, FeX, or Nix, where X=Co, Ni, Cu, Si, Al, Mn, Ge, Ta, Hf, or B. The insulating layer 404 and insulating notch 414 comprises an insulating material like SiN, or an oxide like AlOx, MgO, or MgAlOx, where x is a numeral greater than 1, and can be used in combination with a Heusler alloy layer, and is adjacent to the TM layer 410 to maintain texture and control interdiffusion. The first and second shields 402, 408 and the shield notches 412 may individually comprise a magnetic permeable and electrically conductive material selected from the group consisting of NiFe, CoFe, NiFeCo, alloys, and their combination, NiFe, NiFeCr, or other soft magnetic materials. The side shields 420 may comprise a magnetic material, such as NiFe, CoFe, NiFeCo, CoFeHf, CoFeCr, or combinations thereof. The side shields 420 serve to bias the direction of the FL 406 parallel to the MFS, but the FL's magnetization is free to rotate in response to detect an external magnetic field from the magnetic recording media.

The optional pinned layer 424 comprises may comprise one or more of NiFe, CoFe, NiFeX, CoFeX, Cox, FeX, or Nix, where X=Co, Ni, Cu, Si, Al, Mn, Ge, Ta, Hf, or B, coupled with some AFM layers, such as IrMn, FeMn, or PtMn. The optional tunnel barrier layer 426 comprises MgO. The optional pinned layer 424 may comprise a synthetic anti-ferromagnetic stack, such as comprising a first ferromagnetic (FM) layer, an Ru layer, and a second FM layer, where the first and second FM layers may comprise one or more of NiFe, CoFe, NiFeX, CoFeX, Cox, FeX, or Nix, where X=Co, Ni, Cu, Si, Al, Mn, Ge, Ta, Hf, or B.

During operation, current (at the I+ lead, shown in FIG. 4C) is applied or injected in-plane (i.e., the x-direction) to the TM layer 410 from the side, such as by the current source 270 of FIG. 2. This in-plane charge current will induce a vertical spin current (in the y-direction based on the orientation in FIGS. 4A-B) flowing toward and into the FL 406 due to the spin Hall effect. Once the spin current flows into the FL 406, the spin current causes the FL 406 to rotate or switch, which can be detected by measuring the voltage read out (Vout) based on an anomalous Hall effect, or a tunnel magnetoresistance (TMR) effect vertically across the TM layer 410 and the second shield 408 in FIG. 4A or across the TM layer 410 and the first shield 402 in FIG. 4B). In the anomalous Hall effect case, the spin Hall effect polarizes the electron spins in the TM layer 410. Electrons predominantly of one spin will accumulate at one surface perpendicular to the current direction while electrons of the opposite spin will accumulate at the opposing surface. Because of the spin polarization of the electrons in the TM layer 410 and magnetization of the FL 406, a spin dependent electrical potential exists across the interface between the layers. This electrical potential varies in response to the magnetization direction change of the FL 406 relative to the spin polarity of the electrons in the TM layer 410. With a proper voltage output configuration, the voltage change across this interface can be a signal (Vout) indicating changes in a nearby magnetic field (e.g., from a magnetic media).

In the TMR case, the TMR structure is formed by the ferromagnetic FL 406, and pinned layer 424 being separated by the tunnel barrier layer 426 (e.g., MgO). In the various figures disclosed, layers 424 and 426 are described as optional layers but would be needed if the TMR approach is used. The shield notch 412 and the insulation notch 414 disposed between the FL 406 and the first shield 402 each help to recess the TM layer 410 to avoid any chemical/mechanical impact from the MFS.

Figure 5A:
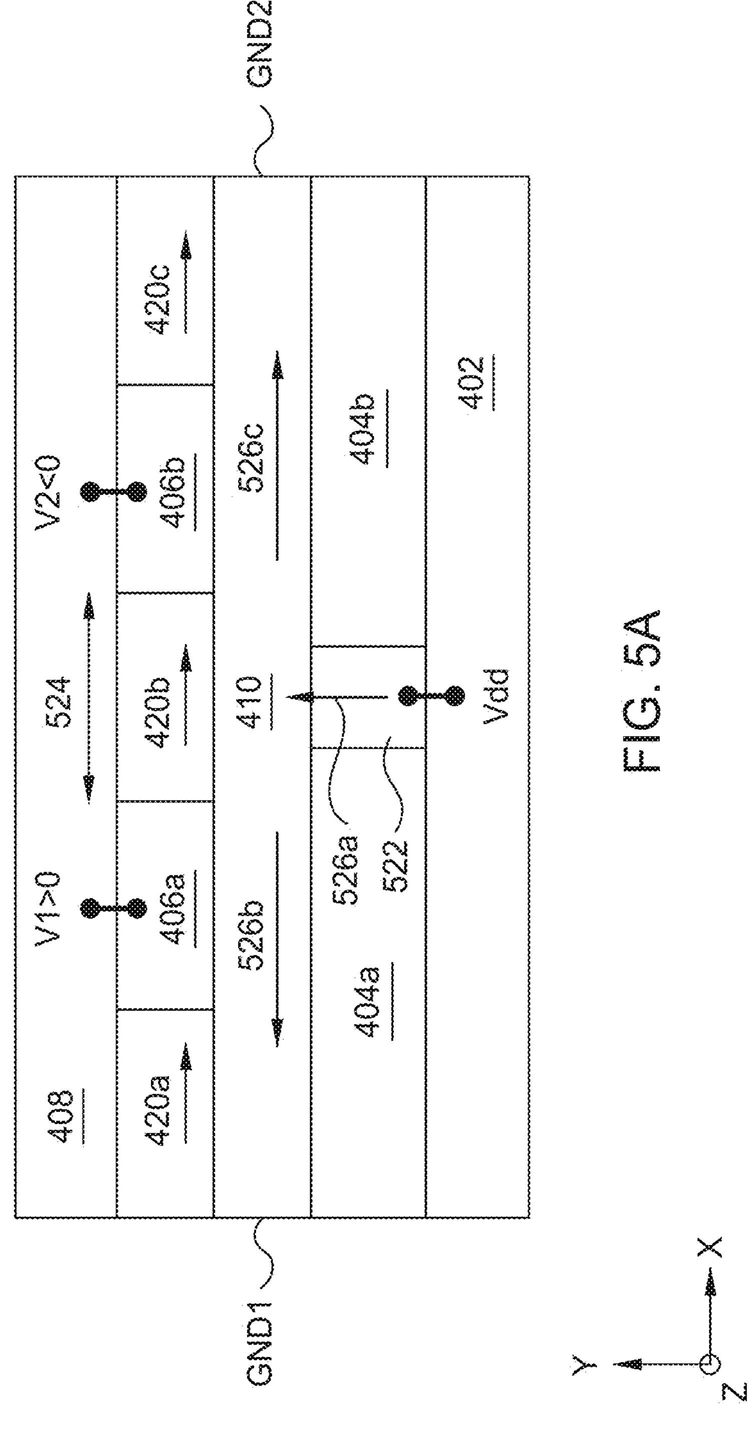
FIG. 5A illustrates an MFS view of a SOT device, according to another embodiment.
Figure 5B:
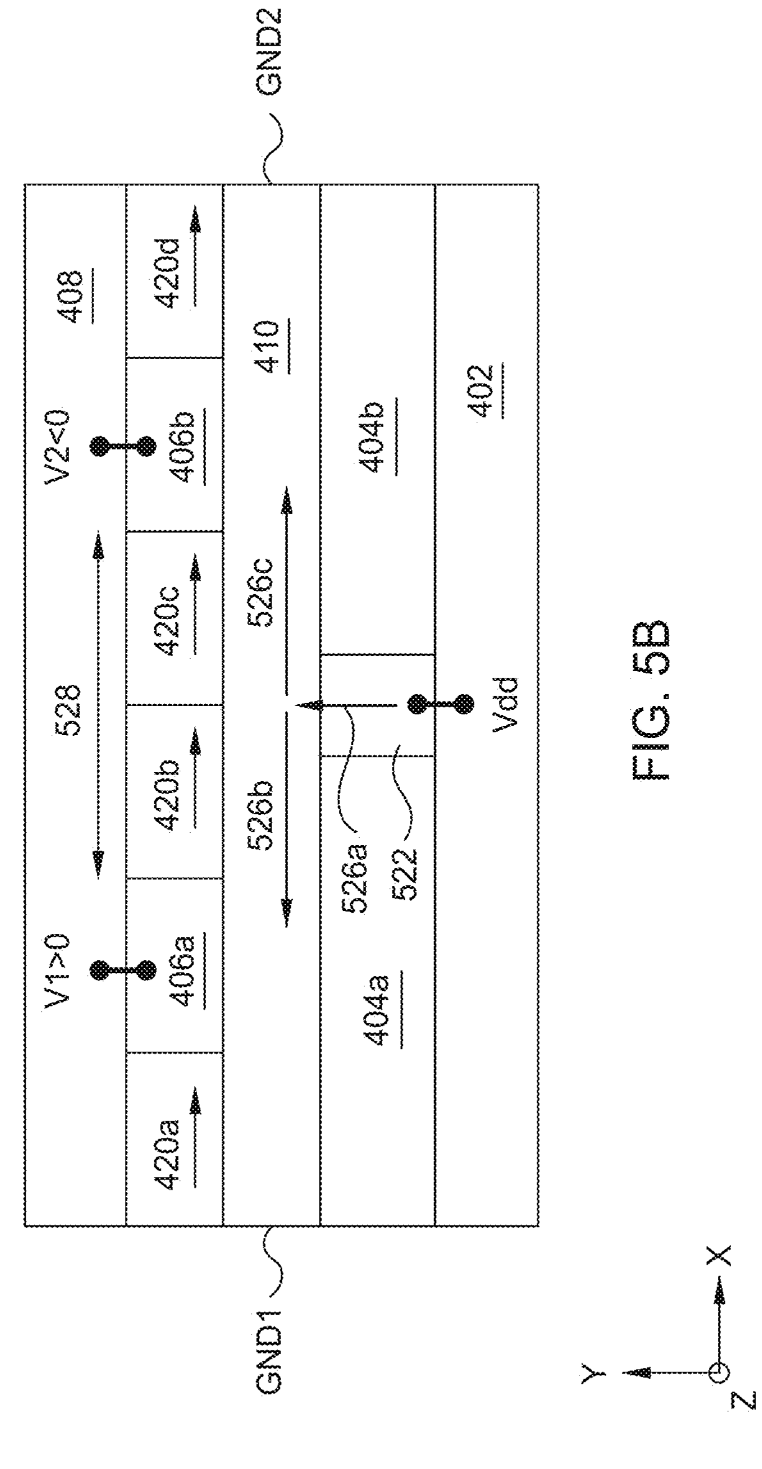
FIG. 5B illustrates an MFS view of a SOT device, according to yet another embodiment.

FIG. 5A illustrates an MFS view of a SOT device 500, according to another embodiment. FIG. 5B illustrates an MFS view of a SOT device 550, according to yet another embodiment. Each SOT device 500, 550 comprises the first shield 402, where a first insulating layer 404*a* and a second insulating layer 404*b* are disposed over the first shield 402. A lead or contact 522 is disposed between the first and second insulating layers 404*a*, 404*b* over the first shield 402. The lead 522 is connected to a current source (Vdd). The TM layer 410 is disposed over the lead 522 and the first and second insulating layers 404*a*, 404*b*. The TM layer 410 may be recessed from the MFS while the first and second FLs 406*a*, 406*b* are disposed at the MFS. In some embodiments, the TM layer 410 is disposed in contact with the lead 522. The TM layer 410 is grounded on both ends, GND1 and GND2. A first FL 406*a* and a second FL 406*b* are disposed over the TM layer 410. While not shown, the SOT device 500 may comprise a first optional tunnel barrier disposed between the first FL 406*a* and the second shield 408, an optional first pinned layer disposed between the first optional tunnel barrier layer and the second shield 408, a second optional tunnel barrier layer disposed between the second FL 406*b* and the second shield 408, and a second optional pinned layer disposed between the second optional tunnel barrier layer and the second shield 408.

In the SOT device 500, the first FL 406*a* is disposed between a first side shield 420*a* and a second side shield 420*b*, and the second FL 406*b* is disposed between the second side shield 420*b* and a third side shield 420*c*. In other words, the first FL 406*a* and the second FL 406*b* are separated by the distance 524 of the second side shield 420*b*. The second shield 408 is disposed over the first and second FLs 406*a*, 406*b* and the side shields 420*a*-420*c*.

In the SOT device 550, the first FL 406*a* is disposed between a first side shield 420*a* and a second side shield 420*b*, and the second FL 406*b* is disposed between the third side shield 420*c* and a fourth side shield 420*d*. In other words, the first FL 406*a* and the second FL 406*b* are separated by the distance 528 of the second and third side shields 420*b*, 420*c*. The first FL 406*a* and the second FL 406*b* are separated by a distance of about 20 nm to about 1000 nm. The second shield 408 is disposed over the first and second FLs 406*a*, 406*b* and the side shields 420*a*-420*d*.

During operation of both SOT devices 500, 550, current is injected into the TM layer 410 from the bottom through the lead 522, as shown by arrow 526*a*. The current then splits such that half of the current flows in-plane in the –x-direction (shown by arrow 526*b*) below the first FL 406*a* and half of the current flows in-plane in the x-direction (shown by arrow 526*c*) below the second FL 406*b*, which due to the direct spin Hall effect, induces two spin currents with opposite spin polarizations that flow vertically into the first and second FLs 406*a*, 406*b*. Because the charge current flows in opposite directions below the first and second FLs 406*a*, 406*b*, the induced voltage output (V1) between the first FL 406*a* and GND1, and the induced voltage output (V2) between the second FL 406*a* and GND2, are opposite to one another. For example, V1 is greater than 0 while V2 is less than 0. Hence, the direct signal phase coming from the first FL 406*a* and the second FL 406*b* are opposite to one another.

If the signal phase of the FLs 406*a*, 406*b* is adjusted through some phase delay means, and the distance 524 or the distance 528 between the first and second FLs 406*a*, 406*b* is small enough, the FLs 406*a*, 406*b* will be disposed over the same common written track on a magnetic media, resulting in the SOT devices 500, 550 to be TDMR devices. In such an embodiment, the first FL 406*a* and a portion of the TM layer 410 operate as a first reader and the second FL 406*b* and a portion of the TM layer 410 operate as a second reader.

Figure 6:
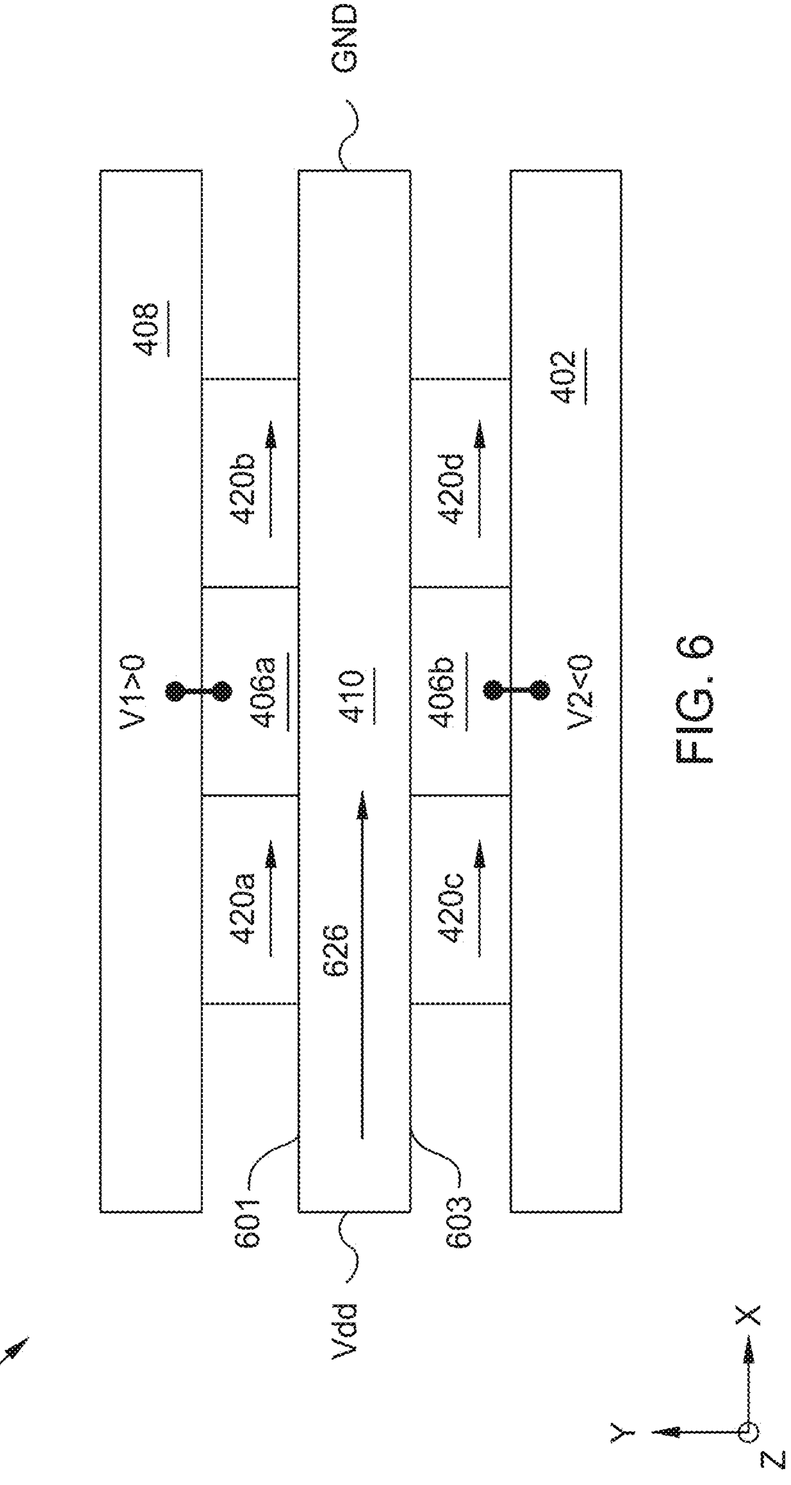
FIG. 6 illustrates an MFS view of a SOT device, according to another embodiment.

FIG. 6 illustrates an MFS view of a SOT device 600, according to another embodiment. The SOT device 600 may be a TDMR device where each FL 406*a*, 406*b* will be a reader. The SOT device 600 comprises the TM layer 410 disposed between the first and second shields 402, 408. While not shown, the insulating layer 404 may be disposed between the TM layer 410 and the first and/or second shields 402, 408. A first FL 406*a* is disposed on a first surface 601 of the TM layer 410, and a second FL 406*b* is disposed on a second surface 603 of the TM layer 410. The first FL 406*a* is disposed between a first side shield 420*a* and a second side shield 420*b*. The second FL 406*b* is disposed between a third side shield 420*c* and a fourth side shield 420*d*. The first and second FLs 406*a*, 406*b* are vertically aligned in the y-direction. The TM layer 410 may be recessed from the MFS while the first and second FLs 406*a*, 406*b* are disposed at the MFS. One end of the TM layer 410 is connected to a current source (Vdd) and the other end is connected to ground (GND). While not shown, an optional tunnel barrier layer and an optional pinned layer may be disposed between each FL 406*a*-406*d* and respective shield 402, 408, like discussed above.

Because the first and second FLs 406*a*, 406*b* are only separated by the thickness of the TM layer 410 in the y-direction, the down-track separation (i.e., the distance between the first and second FLs 406*a*, 406*b*) is highly reduced. For example, the TM layer 410 may have a thickness of about 10 nm to about 15 nm, resulting in the down-track separation being about 20 nm to about 50 nm. The reduced down-track separation is highly beneficial for TDMR operation at skewed conditions, such as at an inner or outer diameter of the magnetic media.

The current source (Vdd) is configured to inject current in-plane in the z-direction into the TM layer 410 towards ground, as shown by arrow 626. Due to the direct spin Hall effect, two spin currents with opposite spin polarizations are induced such that one spin current flows vertically in the y-direction into the first FL 406*a* and the other spin current flows vertically in the –y-direction into the second FL 406*b*. Because the spin current flows in opposite directions to the first and second FLs 406*a*, 406*b*, the induced voltage output (V1) between the first FL 406*a* and GND, and the induced voltage output (V2) between the second FL 406*a* and GND, are opposite to one another. For example, V1 is greater than 0 while V2 is less than 0. Hence the direct signal phase coming from the first FL 406*a* and the second FL 406*b* are opposite to one another.

If measuring the signal individually from the FLs 406*a*, 406*b*, this will be a TDMR device. In such an embodiment, the first FL 406*a* and a portion of the TM layer 410 operate as a first reader and the second FL 406*b* and a portion of the TM layer 410 operate as a second reader. If directly measuring the signal difference between V1 and V2, the SOT device 600 operates as a single reader in a differential mode.

Figure 7A:
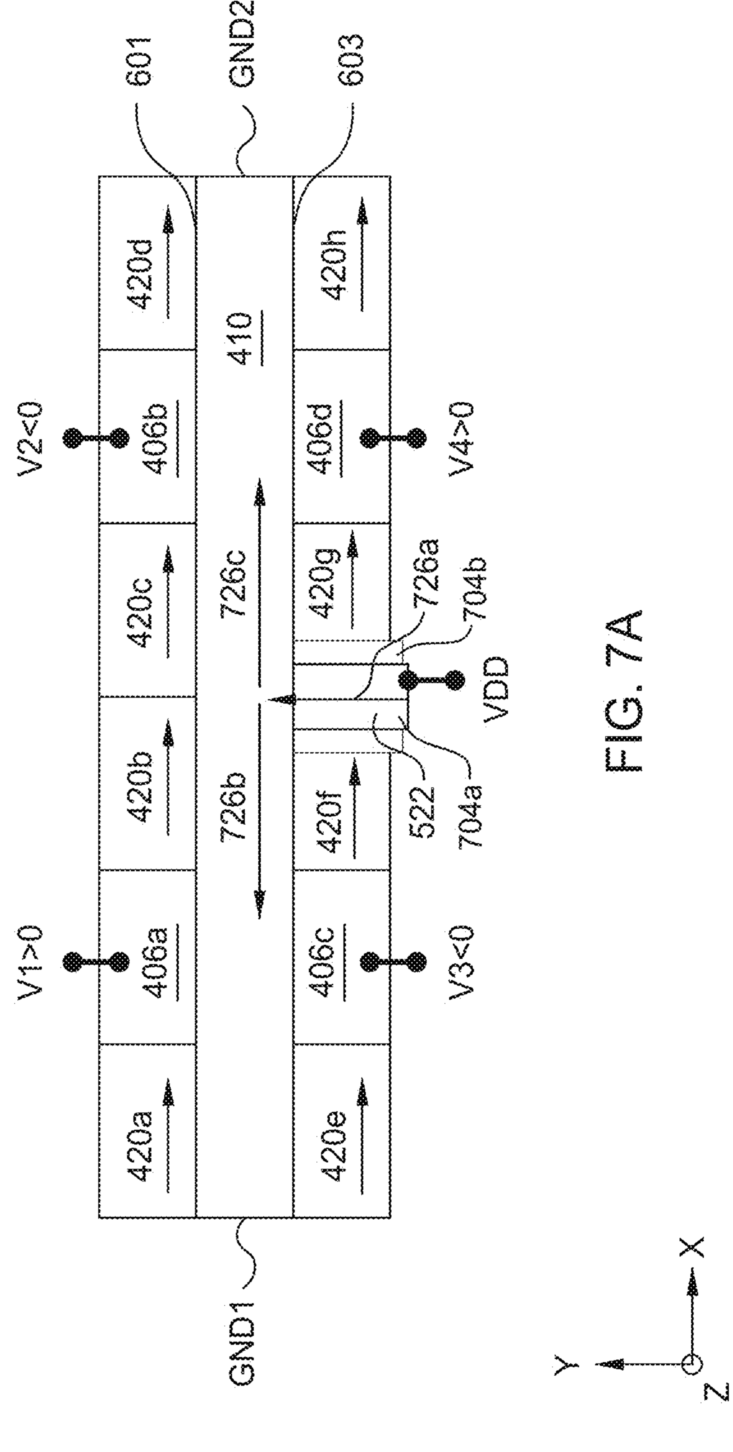
FIG. 7A illustrates an MFS view of a SOT device, according to yet another embodiment.

FIG. 7A illustrates an MFS view of a SOT device 700, according to yet another embodiment. The SOT device 700 may be a sensor bridge or a TDMR device. The SOT device 700 comprises the TM layer 410. A first FL 406*a* and a second FL 406*b* are disposed on a first surface 601 of the TM layer 410, and a third FL 406*c* and a fourth FL 406*d* are disposed on a second surface 603 of the TM layer 410. The first FL 406*a* is disposed between a first side shield 420*a* and a second side shield 420*b*, the second FL 406*b* is disposed between a third side shield 420*c* and a fourth side shield 420*d*, the third FL 406*c* is disposed between a fifth side shield 420*e* and a sixth side shield 420*f*, and the fourth FL 406*d* is disposed between a seventh side shield 420*g* and an eighth side shield 420*h*. The first and third FLs 406*a*, 406*c* may be vertically aligned in the y-direction, and the second and fourth FLs 406*b*, 406*d* are vertically aligned in the y-direction. The TM layer 410 may be recessed from the MFS while the FLs 406*a*, 406*b*, 406*c*, 406*d* are disposed at the MFS. While not shown, an optional tunnel barrier layer and an optional pinned layer may be disposed between each FL 406*a*-406*d* and the respective shield 402, 408, like discussed above.

A lead 522 is disposed between the sixth side shield 420*f* and the seventh side shield 420*g*, and insulating layers 704*a*, 704*b* are disposed between the lead 522 and the sixth and seventh side shields 420*f*, 420*g*. The lead 522 is connected to a current source (Vdd). In some embodiments, the TM layer 410 is disposed in contact with the lead 522. The TM layer 410 is grounded on both ends, GND1 and GND2.

During operation, the current source (Vdd) injects current into the TM layer 410 from the bottom through the lead 522, as shown by arrow 726*a*. The current then splits such that half of the current flows in-plane in the –x-direction (shown by arrow 726*b*) below the first and second FLs 406*a*, 406*b* and half of the current flows in-plane in the x-direction (shown by arrow 726*c*) below the third and fourth FLs 406*c*, 406*d*. Due to the direct spin Hall effect, four spin currents with opposite spin polarizations are induced, where two spin currents with opposite spin polarizations flow vertically in the y-direction into the first and second FLs 406*a*, 406*b* and two spin currents with opposite spin polarizations flow vertically in the –y-direction into the third and fourth FLs 406*c*, 406*d*.

Because the spin current flows in opposite directions to the first and second FLs 406*a*, 406*b*, and in opposite directions to the third and fourth FLs 406*c*, 406*d*, the induced voltage output (V1) between the first FL 406*a* and GND1, and the induced voltage output (V2) between the second FL 406*a* and GND2, are opposite to one another, and the induced voltage output (V3) between the third FL 406*c* and GND1, and the induced voltage output (V4) between the fourth FL 406*d* and GND2, are opposite to one another. As such, the first FL 406*a* and the fourth FL 406*d* will generate signals with the same polarity, and the second FL 406*b* and the third FL 406*c* will generate signals with the same polarity. For example, V1 and V4 are greater than 0 while V2 and V3 are less than 0.

Hence the phase of the first FL 406*a* and the second FL 406*b* are opposite to one another, and the phase of the third FL 406*c* and the fourth FL 406*d* are opposite to one another. However, the phase of the first FL 406*a* and the fourth FL 406*d* are the same, and the phase of the second FL 406*b* and the third FL 406*c* are the same. If voltage outputs, V1 and V3, of the first and third FLs 406*a*, 406*c*, or the voltage outputs, V2 and V4, of the second and fourth FLs 406*b*, 406*d*, are connected together, the signal output is doubled. For example, the SOT device 700 may function as a TDMR read head. In such an embodiment, the first FL 406*a*, the third FL 406*c*, and a portion of the TM layer 410 form a first reader, and the second FL 406*b*, the fourth FL 406*d*, and a portion of the TM layer 410 form a second reader. Both the first and second readers operate in a differential mode. For the first reader, the voltage output is the difference between V1 and V3 (V1-V3). For the second reader, the voltage output is the difference between V2 and V4 (V2-V4).

Figure 7B:
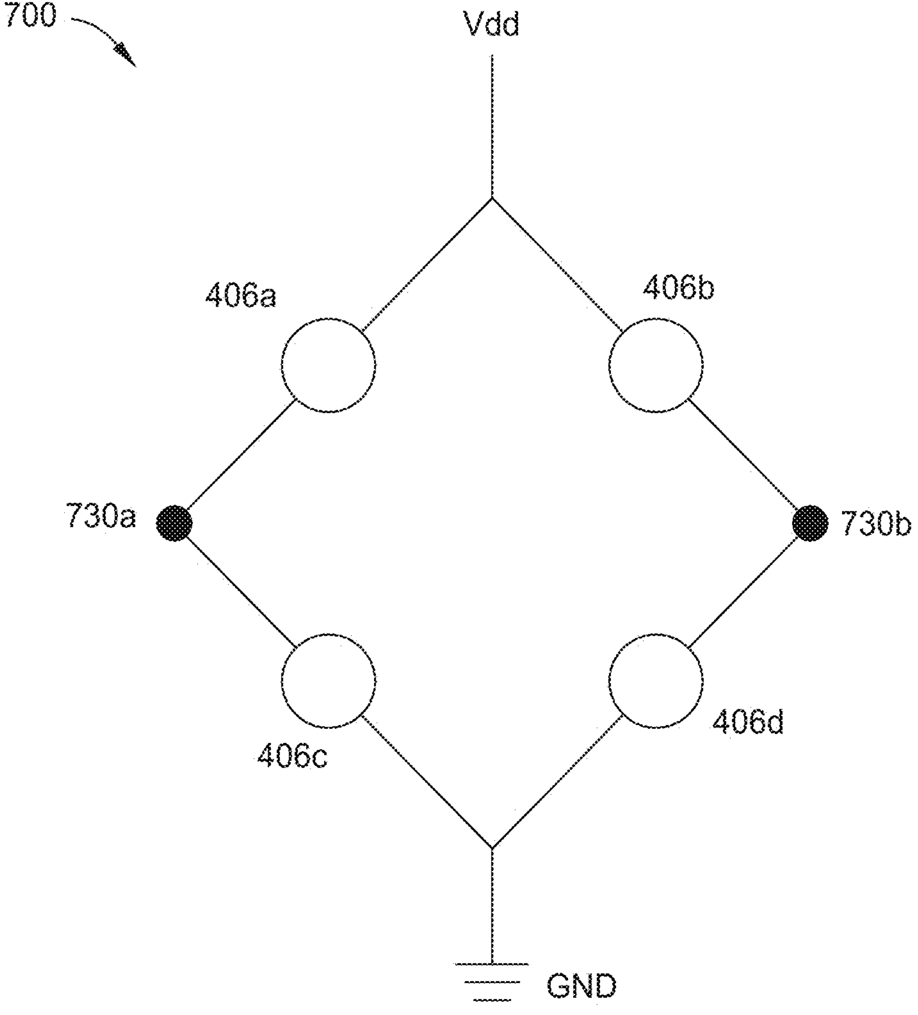
FIG. 7B illustrates the SOT device of FIG. 7A in a sensor bridge configuration according to another embodiment.

FIG. 7B illustrates the SOT device 700 of FIG. 7A in a sensor bridge configuration. In the bridge sensor configuration of FIG. 7B, a first output lead 730*a* is disposed between the first FL 406*a* and the third FL 406*c*, and a second output lead 730*b* is disposed between the second FL 406*b* and the fourth FL 406*d*. Measuring the voltage output between the first and second output leads 730*a*, 730*b* results in the bridge sensor. The bridge sensor may be a Wheatstone bridge. In the bridge configuration, the first and second shields are unnecessary.

Therefore, by utilizing the above-mentioned CIP SOT devices to enable all induced spin currents flow perpendicularly, the full potential of a larger spin Hall angle can be fully utilized, which is important for highly efficient spin-to-charge conversion materials of the TM layer, such as BiSb and YPtBi. Additionally, the SOT devices can achieve fast magnetic switching of the free layers. Furthermore, because the TM layer may be recessed from the MFS and the free layer(s) is exposed at the MFS, the stability of the TM layer, and hence the SOT devices, are improved.

In one embodiment, a spin orbit torque (SOT) device comprises a first shield, a topological material (TM) layer disposed over the first shield, a first free layer disposed over the TM layer, a second free layer disposed over the TM layer, the second free layer being disposed adjacent to the first free layer, and a second shield disposed over the first and second free layers, wherein the SOT device is a current-in-plane (CIP) device.

The SOT device further comprises a lead coupled to the TM layer. The TM layer comprises BiSb or YPtBi. The first free layer is spaced from the second free layer by a first side shield. The first free layer is spaced from the second free layer by a first side shield and a second side shield. The TM layer is recessed from a media facing surface, and wherein the first and second free layers are disposed at the media facing surface. The SOT device further comprises a first tunnel barrier layer disposed between the first free layer and the second shield, a first pinned layer disposed between the first tunnel barrier layer and the second shield, a second tunnel barrier layer disposed between the second free layer and the second shield, and a second pinned layer disposed between the second tunnel barrier layer and the second shield.

A magnetic recording device comprises the SOT device, and a current source coupled to the SOT device, wherein the current source is configured to inject current into the TM layer from a lead, and wherein the current flows perpendicularly in a first direction into the TM layer, and splits to flow in-plane through the TM layer in a second direction and a third direction, the second direction and the third direction being anti-parallel. A first voltage output of the first free layer is opposite to a second voltage output of the second free layer.

In another embodiment, a spin orbit torque (SOT) device comprises a topological material (TM) layer having a first surface and a second surface opposite the first surface, a first free layer disposed on the first surface of the TM layer, and a second free layer disposed on the second surface of the TM layer, wherein the SOT device is a current-in-plane (CIP) device.

A first end of the TM layer is connected to a current source, and wherein a second end of the TM layer is connected to ground. The current source is configured to inject current in-plane into the TM layer, and wherein a first voltage output of the first free layer is opposite to a second voltage output of the second free layer. The SOT device further comprises a third free layer disposed adjacent to the first free layer, a fourth free layer disposed adjacent to the second free layer, one or more first side shields disposed between the first free layer and the third free layer, and one or more second side shields disposed between the second free layer and the fourth free layer. A first voltage output of the first free layer is opposite to a second voltage output of the second free layer and opposite to a third voltage output of the third free layer, and wherein the second voltage output of the second free layer is opposite to a fourth voltage output of the fourth free layer.

A current source is configured to inject current into the TM layer from a lead, and wherein the current flows perpendicularly in a first direction into the TM layer, and splits to flow in-plane through the TM layer in a second direction and a third direction, the second direction and the third direction being anti-parallel. The first, second, third, and fourth free layers are arranged in a bridge configuration. The TM layer comprises BiSb or YPtBi, and wherein the TM layer is recessed from the MFS. A first end of the TM layer is connected to a first ground, and wherein a second end of the TM layer is connected to a second ground. The SOT device further comprises a first tunnel barrier layer disposed on the first free, a first pinned layer disposed on the first tunnel barrier layer, the first tunnel barrier layer being disposed between the first free layer and the first pinned layer, a second tunnel barrier layer disposed on the second free layer, and a second pinned layer disposed on the second tunnel barrier, the second tunnel barrier layer being disposed between the second free layer and the second pinned layer. A magnetic recording device comprises the SOT device.

In yet another embodiment, a sensor comprises a Wheatstone bridge, the Wheatstone bridge comprising: a first free layer, a second free layer disposed adjacent to the first free layer, a topological material (TM) layer disposed over the first and second free layers, a third free layer disposed over the TM layer, a fourth free layer disposed adjacent to the third free layer, a first output lead disposed between the first free layer and the third free layer, a second output lead disposed between the second free layer and the fourth free layer, and means for measuring the voltage output between the first and second output leads.

The TM layer comprises BiSb or YPtBi.

While the foregoing is directed to embodiments of the present disclosure, other and further embodiments of the disclosure may be devised without departing from the basic scope thereof, and the scope thereof is determined by the claims that follow.

What is claimed is:

1. A spin orbit torque (SOT) device, comprising:
- a first shield;
- a topological material (TM) layer disposed over the first shield;
- a first free layer disposed over the TM layer;
- a second free layer disposed over the TM layer, the second free layer being disposed adjacent to the first free layer; and
- a second shield disposed over the first and second free layers, wherein the SOT device is a current-in-plane (CIP) device.

2. The SOT device of claim 1, further comprising a lead coupled to the TM layer.

3. The SOT device of claim 1, wherein the TM layer comprises BiSb or YPtBi.

4. The SOT device of claim 1, wherein the first free layer is spaced from the second free layer by a first side shield.

5. The SOT device of claim 1, wherein the first free layer is spaced from the second free layer by a first side shield and a second side shield.

6. The SOT device of claim 1, wherein the TM layer is recessed from a media facing surface, and wherein the first and second free layers are disposed at the media facing surface.

7. The SOT device of claim 1, further comprising:

a first tunnel barrier layer disposed between the first free layer and the second shield;

a first pinned layer disposed between the first tunnel barrier layer and the second shield;

a second tunnel barrier layer disposed between the second free layer and the second shield; and a second pinned layer disposed between the second tunnel barrier layer and the second shield.

8. A magnetic recording device, comprising:

the SOT device of claim 1; and a current source coupled to the SOT device, wherein the current source is configured to inject current into the TM layer from a lead, and wherein the current flows perpendicularly in a first direction into the TM layer, and splits to flow in-plane through the TM layer in a second direction and a third direction, the second direction and the third direction being anti-parallel.

9. The magnetic recording device of claim 8, wherein a first voltage output of the first free layer is opposite to a second voltage output of the second free layer.

10. A spin orbit torque (SOT) device, comprising:

a topological material (TM) layer having a first surface and a second surface opposite the first surface;

a first free layer disposed on the first surface of the TM layer; and a second free layer disposed on the second surface of the TM layer, wherein the SOT device is a current-in-plane (CIP) device.

11. The SOT device of claim 10, wherein a first end of the TM layer is connected to a current source, and wherein a second end of the TM layer is connected to ground.

12. The SOT device of claim 11, wherein the current source is configured to inject current in-plane into the TM layer, and wherein a first voltage output of the first free layer is opposite to a second voltage output of the second free layer.

13. The SOT device of claim 10, further comprising:

a third free layer disposed adjacent to the first free layer;

a fourth free layer disposed adjacent to the second free layer;

one or more first side shields disposed between the first free layer and the third free layer; and one or more second side shields disposed between the second free layer and the fourth free layer.

14. The SOT device of claim 13, wherein a first voltage output of the first free layer is opposite to a second voltage output of the second free layer and opposite to a third voltage output of the third free layer, and wherein the second voltage output of the second free layer is opposite to a fourth voltage output of the fourth free layer.

15. The SOT device of claim 13, wherein a current source is configured to inject current into the TM layer from a lead, and wherein the current flows perpendicularly in a first direction into the TM layer, and splits to flow in-plane through the TM layer in a second direction and a third direction, the second direction and the third direction being anti-parallel.

16. The SOT device of claim 13, wherein the first, second, third, and fourth free layers are arranged in a bridge configuration.

17. The SOT device of claim 10, wherein the TM layer comprises BiSb or YPtBi, and wherein the TM layer is recessed from a media facing surface.

18. The SOT device of claim 10, wherein a first end of the TM layer is connected to a first ground, and wherein a second end of the TM layer is connected to a second ground.

19. The SOT device of claim 10, further comprising:

a first tunnel barrier layer disposed on the first free;

a first pinned layer disposed on the first tunnel barrier layer, the first tunnel barrier layer being disposed between the first free layer and the first pinned layer;

a second tunnel barrier layer disposed on the second free layer; and a second pinned layer disposed on the second tunnel barrier, the second tunnel barrier layer being disposed between the second free layer and the second pinned layer.

20. A magnetic recording device, comprising the SOT device of claim 10.

21. A sensor, comprising:

a Wheatstone bridge, the Wheatstone bridge comprising:

a first free layer;

a second free layer disposed adjacent to the first free layer;

a topological material (TM) layer disposed over the first and second free layers;

a third free layer disposed over the TM layer;

a fourth free layer disposed adjacent to the third free layer;

a first output lead disposed between the first free layer and the third free layer;

a second output lead disposed between the second free layer and the fourth free layer; and means for measuring the voltage output between the first and second output leads.

22. The magnetic recording device of claim 21, wherein the TM layer comprises BiSb or YPtBi.

* * * * *